United States Patent
Lee et al.

(10) Patent No.: US 6,608,578 B2
(45) Date of Patent: Aug. 19, 2003

(54) CURRENT CELL DRIVING CIRCUIT IN DIGITAL-TO-ANALOG CONVERTER

(75) Inventors: Seung Chul Lee, Seoul-Shi (KR); Jong Kee Kwon, Daejon-Shi (KR); Kwi Dong Kim, Daejon-Shi (KR); Kyung Soo Kim, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 22 days.

(21) Appl. No.: 10/032,720

(22) Filed: Dec. 27, 2001

(65) Prior Publication Data

US 2003/0080889 A1 May 1, 2003

(30) Foreign Application Priority Data

Nov. 16, 2001 (KR) .................................. 2001-0071309

(51) Int. Cl.[7] .............................................. H03M 1/66
(52) U.S. Cl. ...................................... 341/144; 341/118
(58) Field of Search .............................. 341/144, 118, 341/120

(56) References Cited

U.S. PATENT DOCUMENTS

| | | | |
|---|---|---|---|
| 5,463,394 A | 10/1995 | Sun | 341/136 |
| 6,268,816 B1 * | 7/2001 | Bult et al. | 341/144 |
| 6,295,012 B1 | 9/2001 | Greig | 341/136 |
| 6,414,618 B2 * | 7/2002 | Bult et al. | 341/144 |

OTHER PUBLICATIONS

IEEE 1998 Custom Integrated Circuits Conference, A 12 bit 200 MHz Low Glitch CMOS D/A Converter, 4 pages.

IEEE Journal of Solid–State Circuits, vol. 36, No. 3, Mar. 2001, 10 pages.

* cited by examiner

*Primary Examiner*—Peguy JeanPierre
(74) *Attorney, Agent, or Firm*—Blakely, Sokoloff, Taylor & Zafman

(57) ABSTRACT

The present invention relates to a current cell driving circuit in a digital-to-analog converter. The current cell driving circuit limits the potential of differential control signals to a given potential level by means of a voltage limiter using a parasitic capacitance of a transistor. Therefore, the present invention can effectively limit the potential of differential control signals DP and DN without compromising the power consumption and the circuit area and also can minimize the transfer time.

7 Claims, 5 Drawing Sheets

CURRENT CELL DRIVING CIRCUIT IN DIGITAL-TO-ANALOG CONVERTER

BACKGROUND OF THE INVENTION

1. Field of the Invention

The invention relates generally to a digital-to-analog converter, and more particularly, to a current-steering digital-to-analog converter capable of minimizing glitch noises at an output terminal.

2. Description of the Prior Art

As a very large scale integration (VLSI) technology is rapidly growing according to Moore's law, it is possible to integrate analog and digital systems, which was realized on a conventional board, on a single chip. Therefore, the digital-to-analog converter (DAC), the interface block between the analog and digital systems, is considered as the key component completing the integrated system design.

DACs can be classified into a DAC for voice signal and a DAC for image signal based on the signal bandwidth. The DAC for voice signal processing has a sigma-delta structure for more than 16b resolution at low conversion rate. On the other hands, the DAC for image signal processing within the digital TV, HDTV, and medical equipment has a current-steering structure that can be implemented at high speed. A medium low-speed DAC having a R-2R ladder structure is applied to a portable measurement apparatus, an industry mechanical control apparatus, a digital control amplifier, and the like.

Usually, most high-speed and high-resolution DAC adopt a current-steering structure for its good linearity, operating speed and cost efficiency. There has recently been developed a current-steering DAC having a high static performance of over 12 bits resolution.

However, there is a problem that the dynamic performance of the current-steering DAC is abruptly degraded by glitch noise occurring at the output terminal, when the output signal frequency is increased to several dozens of MHz band.

Since the glitch noise is mainly caused by switch control signals, a current cell driving circuit generating the switch control signals is the critical block determining the dynamic performance of the current-steering DAC.

Therefore, examples for reducing the glitch noise include U.S. Pat. No. 5,463,394 issued on Oct. 31, 1995 ('Current Switch for a High Speed DAC'), U.S. Pat. No. 6,295,012 issued on Aug. 25, 1999 ('CMOS DAC with High Impedance Differential Current Drivers'), 'A 12bit 200 MHz Low Glitch CMOS D/A Converter' written in 'CICC98' by 'A Van Bosch, et al.' (June 1998) and 'A 10-bit 1-Gsample/s Nyquist Current-Steering CMOS D/A Converter' written in 'IEEE, JSSC' by 'A Van Bosch, et al.' (March 2001).

In order to reduce the glitch noise, the above prior arts employed methods of adjusting a cross point of differential control signals or reducing a transition time of the signals. As these methods, however, transit the control signals over the full range (from 0V to VDD or from VDD to OV) corresponding to the amount of the supply power voltage, there is a limit in reducing the glitch noise due to an influence of the control signals to the final output signal. Further, there was published a technology of reducing the amplitude of the control signals through voltage limiters. However, the conventional voltage limiters increase the transition time and make it difficult to be employed in high-speed applications.

SUMMARY OF THE INVENTION

The present invention is contrived to solve the above problems, and an object of the present invention is to provide a current cell driving circuit in a digital-to-analog converter (DAC) that can effectively limit the amplitude of the control signals and minimize the transition time, while not compromising the power consumption or the circuit area.

In order to accomplish the above object, a current cell driving circuit according to the present invention comprises a latch means for latching input signals depending on a clock signal to output first and second latch signals; and a voltage limiter means for limiting the first and second latch signals to a given level to output the first and second differential control signals.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
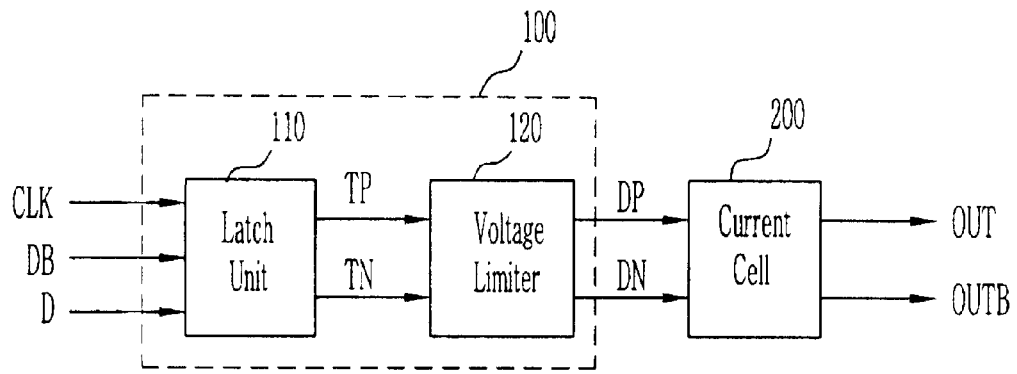
FIG. 1 is a block diagram for explaining a current cell driving circuit in a digital-to-analog converter according to one embodiment of the present invention.

The present invention will be described in detail by way of a preferred embodiment with reference to accompanying drawings, in which like reference numerals are used to identify the same or similar parts.

Figure 2:
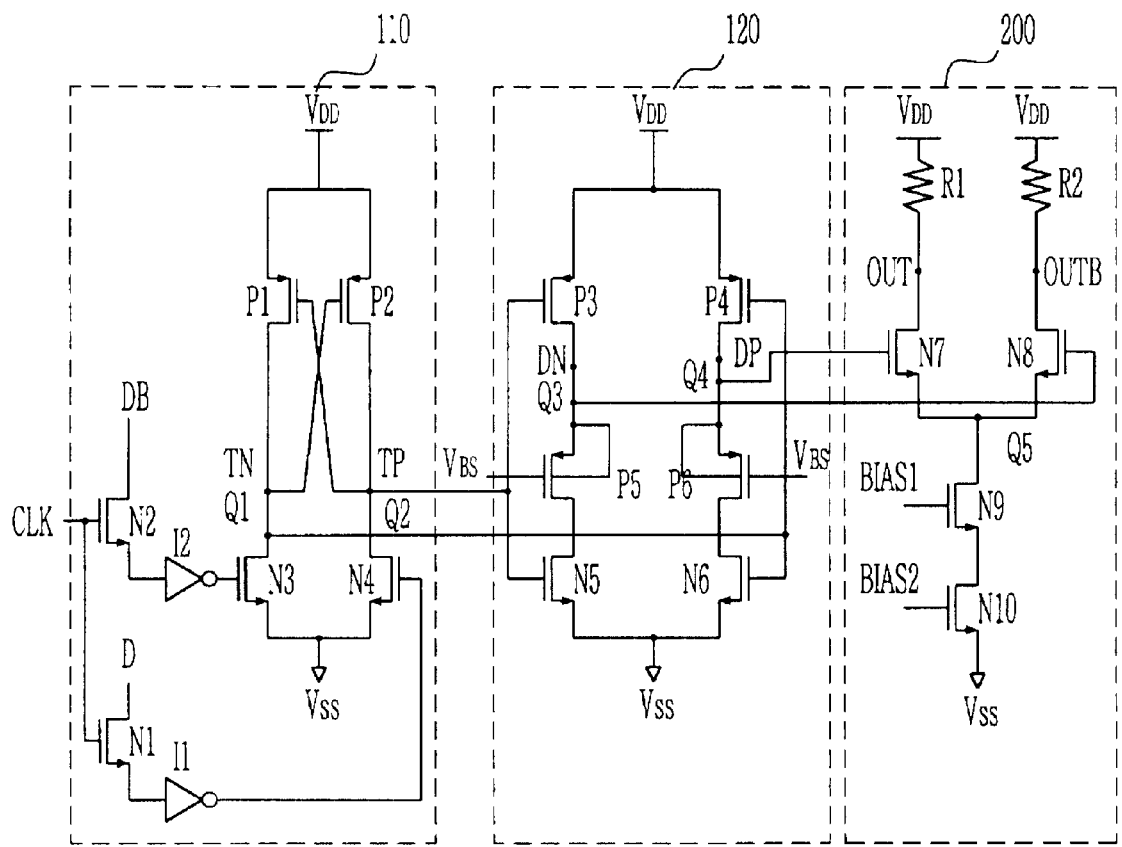
FIG. 2 is a detailed circuit diagram of the current cell driving circuit in the digital-to-analog converter shown in FIG. 1.

FIG. 1 is a basic block diagram for explaining a current cell driving circuit in a digital-to-analog converter (DAC) according to one embodiment of the present invention, and FIG. 2 is a detailed circuit diagram of FIG. 1.

Referring now to FIG. 1, the DAC of the present invention mainly includes a current cell driving circuit unit 100 for driving a current cell 200, and the current cell 200 driven depending on output signals DP and DN of the current cell driving circuit unit 100 for generating a given current. The current cell driving circuit unit 100 comprises a latch unit 110 for optimizing a cross point of the output signals DP and DN, and a voltage limiter 120 for limiting the level of the output signals DP and DN.

In other words, the current cell driving circuit unit 100 includes the latch unit 110 for latching digital signals D and DB depending on a clock signal CLK to output latch signals TP and TN a cross point of which is optimized, and the voltage limiter 120 for output signals DP and DN (hereinafter called "differential control signal) the potential of which is limited, according to the latch signals TP and TN.

Referring now to FIG. 2, the latch unit 110 includes a first NMOS transistor N1 driven by the clock signal CLK, for transferring the digital signal D to a first inverter I1, a second NMOS transistor N2 driven by the clock signal CLK, for transferring the digital signal DB to a second inverter I2, a first PMOS transistor P1 connected between the supply power VDD and a first node Q1 and driven depending on the potential (i.e., latch signal TP) of a second node Q2, a third NMOS transistor N3 connected between the first node Q1 and the ground voltage source VSS and driven depending on the output signal of the second inverter I2, a second PMOS transistor P2 connected between the supply power VDD and the second node Q2 and driven depending on the potential (i.e., latch signal TN) of the first node Q1, and a fourth NMOS transistor N4 connected between the second node Q2 and the ground voltage source VSS and driven depending on the output signal of the first inverter I1.

The voltage limiter 120 includes a third PMOS transistor P3 connected between the supply power voltage VDD and the third node Q3 and driven depending on the latch signal TP, a fifth PMOS transistor P5 driven depending on a fixed bias signal $V_{BS}$ and a fifth NMOS transistor N5 driven depending on the latch signal TP wherein the fifth PMOS transistor P5 and the fifth NMOS transistor N5 are serially connected between the third node Q3 and the ground voltage source VSS, a fourth PMOS transistor P4 connected between the supply power voltage VDD and the fourth node Q4 and driven depending on the latch signal TN, and a sixth PMOS transistor P6 driven depending on the fixed bias signal $V_{BS}$ and a sixth NMOS transistor N6 driven depending on the latch signal TN wherein the sixth PMOS transistor P6 and the sixth NMOS transistor N6 are connected between the fourth node Q4 and the ground voltage source VSS. At this time, sources of the fifth and sixth PMOS transistors P5 and P6 are connected to a bulk (n-well).

The current cell 200 includes a first resistor R1 connected between the supply power voltage VDD and the output terminal OUT, a seventh NMOS transistor N7 connected between the output terminal OUT and the fifth node Q5 and driven depending on the potential (i.e., differential control signal DP) of the fourth node Q4, a second resistor R2 connected between the supply power voltage VDD and the output terminal OUTB, an eighth NMOS transistor N8 connected between the output terminal OUTB and the fifth node Q5 and driven depending on the potential (i.e., differential control signal DN) of the third node Q3, and a ninth NMOS transistor N9 driven depending on a first bias signal BIAS1 and a tenth NMOS transistor N10 driven depending on a second bias signal BIAS2 wherein the ninth NMOS transistor N9 and the tenth NMOS transistor N1O are serially connected between the fifth node Q5 and the ground voltage source VSS.

An operation of the current cell driving circuit in the DAC thus constructed will be below explained in detail.

First, it should be understood that the latch unit 110 is a structure that is usually used in the current cell driving circuit 100. When opposite digital signals D and DB are inputted, the cross point of the latch signals TP and TN that will be outputted to the first and second nodes Q1 and Q2, is controlled by the ratio of the first and second PMOS transistors P1 and P2 and the third and fourth NMOS transistors N3 and N4.

For example, if the clock signal CLK is shifted to a HIGH state in a state that the digital signals D and DB each having a HIGH state and a LOW state are inputted to the latch unit 110, the first and second NMOS transistors N1 and N2 are turned on, so that the digital signal D is sent to the first inverter I1 via the first NMOS transistor N1 and the digital signal DB is sent to the second inverters I1 and I2 via the second NMOS transistor N2.

Then, each of the digital signals D and DB, which are sent to the first and second inverters I1 and I2, respectively, is inverted by means of the first and second inverters I1 and I2. Thus, a HIGH signal is inputted to the third NMOS transistor N3 and a LOW signal is inputted to the fourth NMOS transistor N4. Therefore, the third NMOS transistor N3 is turned on to fall the latch signal TN to a ground potential, while the fourth NMOS transistor N4 is turned off to make the second node Q2 float, so that the latch signal TP maintains a state before the floating state. Thereafter, as the latch signal TN is fallen to the ground potential, the second PMOS transistor P2 is turned on to raise the latch signal TP to the supply power voltage.

Figure 3:
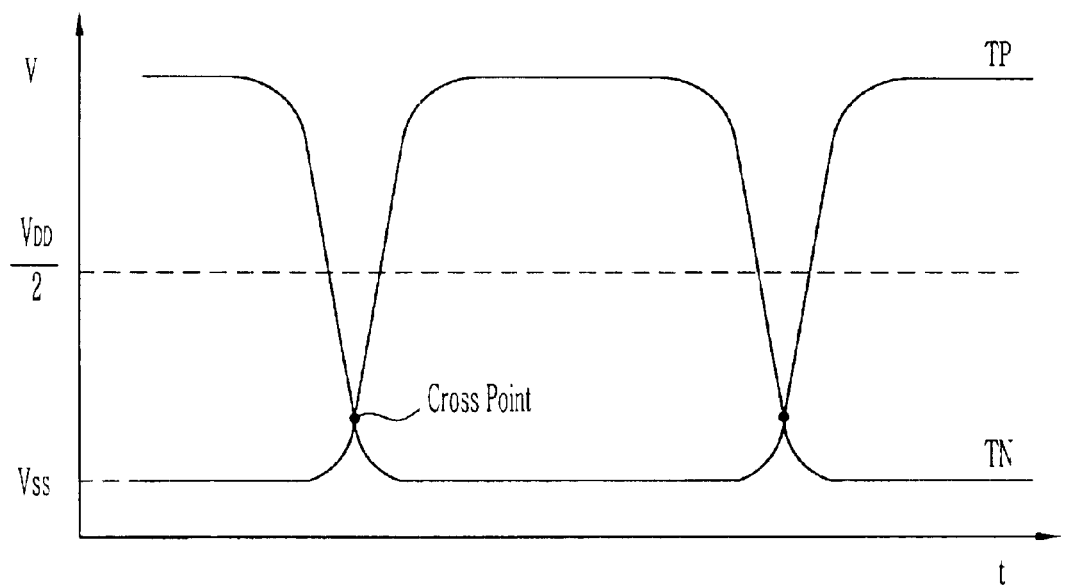
FIG. 3 shows a waveform for explaining a cross point of latch signals TP and TN in a latch unit shown in FIG. 2.

Therefore, as shown in FIG. 3, the latch signal TN starts to fall to the ground potential from the time when the third NMOS transistor N3 is turned on, while the latch signal TP starts to gradually increase to the supply power voltage from the time when the second PMOS transistor P2 is turned on by an decrease of the latch signal TN, so that the cross point of the latch signals TP and TN appears at a LOW level (i.e., below VDD/2). The cross point of the latch signals TP and TN is controlled by the size (i.e., W/L) of the third and fourth NMOS transistors N3 and N4 or the first and second PMOS transistors P1 and P2.

Figure 4:
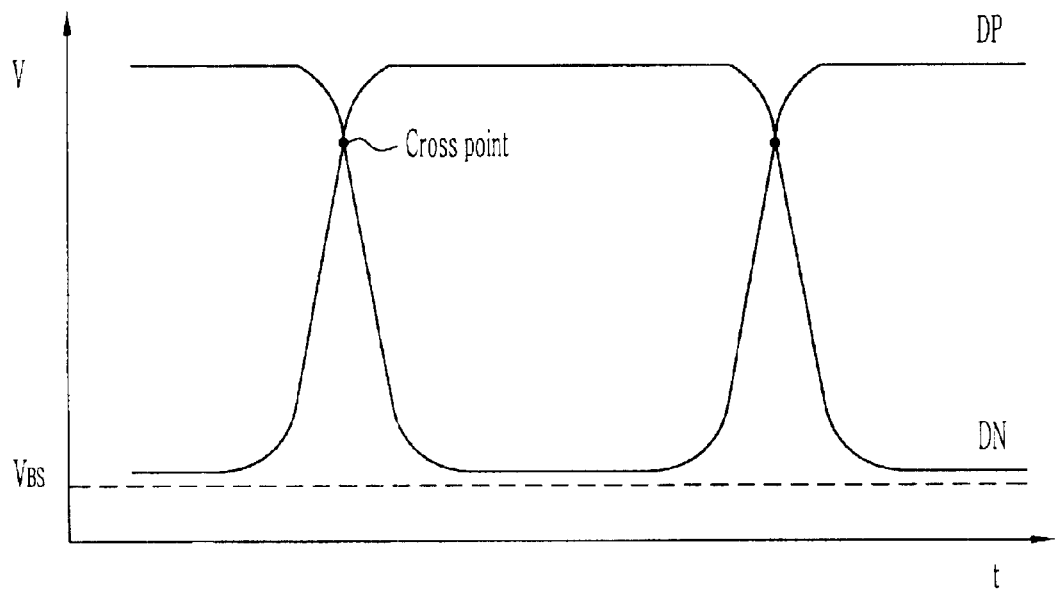
FIG. 4 shows a waveform for explaining a cross point of differential control signals DP and DN in a voltage limiter shown in FIG. 2.

Meanwhile, the voltage limiter 120 is basically operated as an inverter for inverting the latch signals TP and TN being the output signals of the latch unit 110. The latch signal TP is inverted by the third PMOS transistor P3 and the fifth NMOS transistor N5, and the latch signal TN is inverted by the fourth PMOS transistor P4 and the sixth NMOS transistor N6. Therefore, as shown in FIG. 4, the cross point of the differential control signals DP and DN appears at HIGH level (i.e., over VDD/2).

Figure 5:
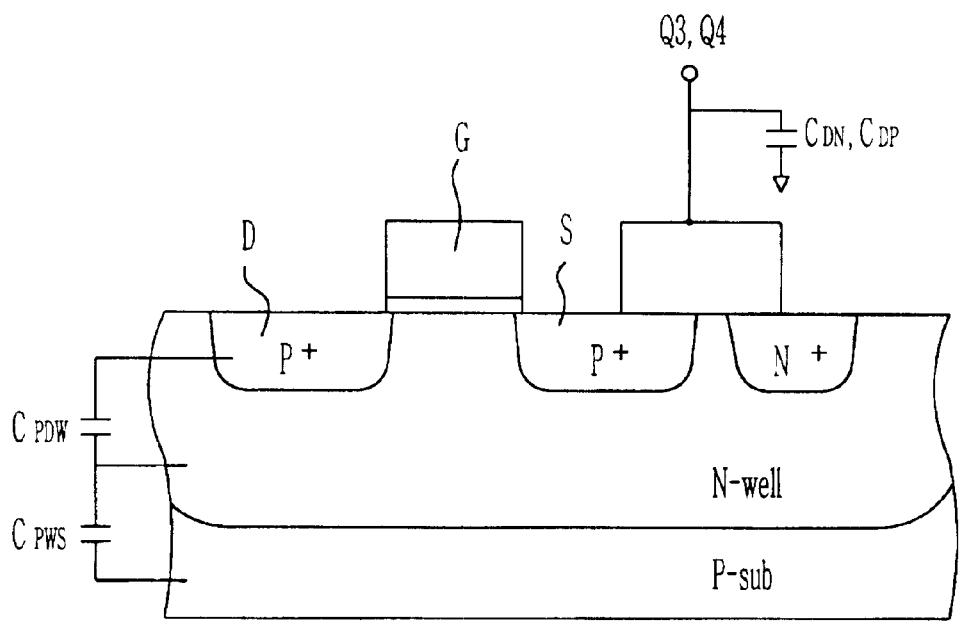
FIG. 5 is a cross sectional view of fifth and sixth PMOS transistors P5 and P6 in the voltage limiter shown in FIG. 2.

In addition, a PMOS transistor P5 is connected between the PMOS transistor P3 and the NMOS transistor N5, in which a source of the PMOS transistor P5 is connected to a bulk (n-well) and a gate of the PMOS transistor P5 is applied with a fixed bias signal $V_{BS}$. A PMOS transistor P6 is connected between the PMOS transistor P4 and the NMOS transistor N6, with a source of the PMOS transistor P6 being connected to a bulk (N-well) and a gate of the PMOS transistor P6 being applied with a fixed bias signal $V_{BS}$. The PMOS transistors P5 and P6 have a structure of FIG. 5. Thus, a parasitic capacitance CPDW is formed between a drain and the N-well of the PMOS transistors P5 and P6 as Shown in FIG. 5.

An operation of the voltage limiter 120 will be now below explained in detail. The fixed bias signal $V_{BS}$ having a constant potential is first inputted to gates G of the fifth and sixth PMOS transistors P5 and P6. With this state, if the latch signal TP of a HIGH state is inputted to the third PMOS transistor P3 and the fifth NMOS transistors N5, respectively and the latch signal TN of a LOW state is inputted to the fourth PMOS transistor P4 and the sixth NMOS transistor N6, the third PMOS transistor P3 is turned off and the fifth NMOS transistor N5 is turned on to fall the potential of the control signal DN, while the fourth PMOS transistor P4 is turned on and the sixth NMOS transistor N6 is turned off to raise the control signal DP.

Figure 6:
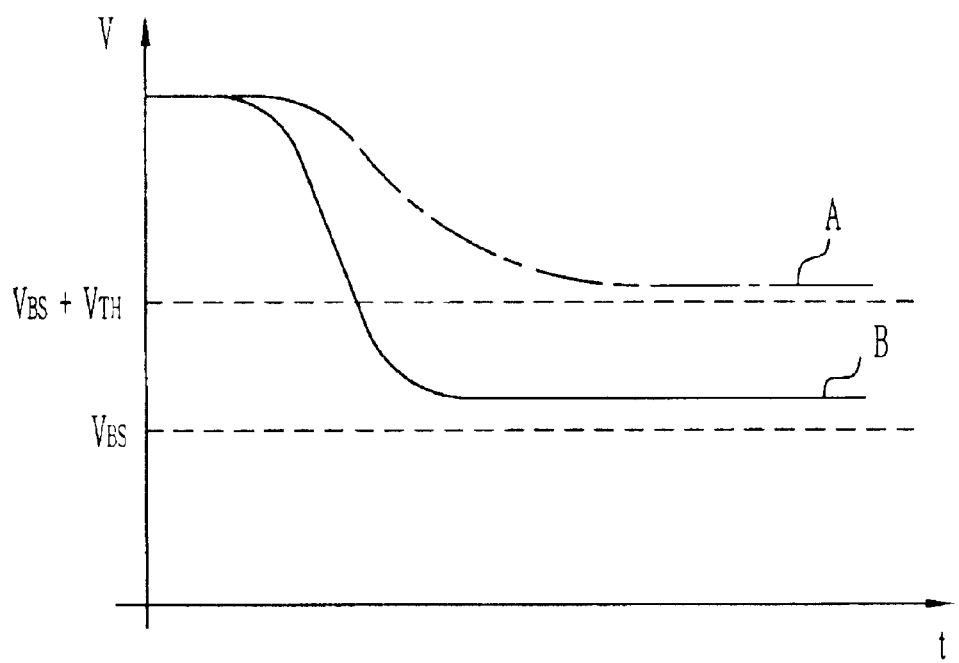
FIG. 6 shows a waveform for explaining a final drop potential of the differential control signals DP and DN in the voltage limiter shown in FIG. 2.

If the potential of the differential control signal DN reaches '$V_{BS}+V_{TH}$', the fifth PMOS transistor P5 is turned off, so that no further current flows. Due to this, as shown in FIG. 6, the potential of the differential control signal DN is slowly fallen, since currents gradually reduce around a '$V_{BS}+V_{TH}$' potential level (A of FIG. 6), which makes a high speed operation of the current cell 200 difficult. At this time, '$V_{TH}$' means a threshold voltage of the fifth PMOS transistor P5.

However, if the source S of the fifth PMOS transistor P5 is connected to the bulk (n-well) and the parasitic capacitance CPDW having more than a given amount is formed between the drain D and the source S, variations in the potential of the drain D are transferred to the source S through the capacitance CPDW, when the current amount of the fifth PMOS transistor P5 is reduced around the turn-off voltage. Thus, a high-speed operation of the current cell 100 can be achieved by rapidly falling the potential of the differential control signal DN around the potential level (B of FIG. 6) of the fixed bias signal $V_{BS}$ below the '$V_{BS}+V_{TH}$' potential at the same speed of the potential falling speed of the drain D.

Then, if the latch signal TP is shifted from a HIGH state to a LOW state and the latch signal TN is shifted from a LOW state to a HIGH state, the potential of the differential control signal DN is increased as the third PMOS transistor P3 is turned on and the fifth NMOS transistor N5 is turned off while the potential of the differential control signal DP is fallen as the fourth PMOS transistor P4 is turned off and the sixth NMOS transistor N6 is turned on.

In other words, if the latch signal TP is shifted from a HIGH state to a LOW state and the latch signal TN is shifted from a LOW state to a HIGH state, a driving characteristic of the voltage limiter 120 is driven directly opposite to that where the latch signal TP is at HIGH state and the latch signal TN is at a LOW state. Therefore, an explanation of the driving characteristic thereafter will be omitted.

Meanwhile, the current cell 200 is a general differential switch structure and is driven by the differential control signals DP and DN. An operation of the current cell 200 will be below explained.

First, if a first bias signal BIAS1 having a constant potential is applied to the ninth NMOS transistor N9 and a second bias signal BIAS2 is applied to the tenth NMOS transistor N10, the ninth and tenth NMOS transistors N9 and N10 are driven by a given current source. With this state, if the differential control signals DP and DN having different potential levels are inputted to the seventh NMOS transistor N7 and the eighth NMOS transistor N8, respectively, output signals are outputted to the output terminals OUT and OUTB depending on the difference in the potentials of the differential control signals DP and DN.

As mentioned above, the voltage limiter 120 forms the capacitance CPDW between the drain D and the source S, by connecting the sources S of the fifth and sixth PMOS transistors P5 and P6 to the bulk (n-well), so that one of the differential control signals DP and DN is limited to a given potential level. At this time, as shown in FIG. 5, the final falling potential voltage and the transfer time of one of the differential control signals DP and DN the level of which is limited to the given potential level is proportional to the amount of the capacitance CPDW between the drain D and the source S of the fifth PMOS transistor P5 or the sixth PMOS transistor P6 and is in inverse proportion to the amount of other parasitic capacitance (CPWS+CDN or CPWS+CDP) in which the drain D is not connected. Therefore, the final falling potential voltage and the transfer time of the differential control signals DP and DN can be controlled by adjusting the drain D region. At this time, 'CPWS' indicates the parasitic capacitance between the bulk (n-well) and a p type substrate (p-sub), and 'CDN' indicates the parasitic capacitance between the third node Q3 and the eighth NMOS transistor N8 or the parasitic capacitance between the fourth node Q4 and the seventh NMOS transistor N7.

Therefore, the present invention proposes a new layout scheme of a PMOS transistor for implementing the drain D region extended than the conventional drain region.

Figure 7:
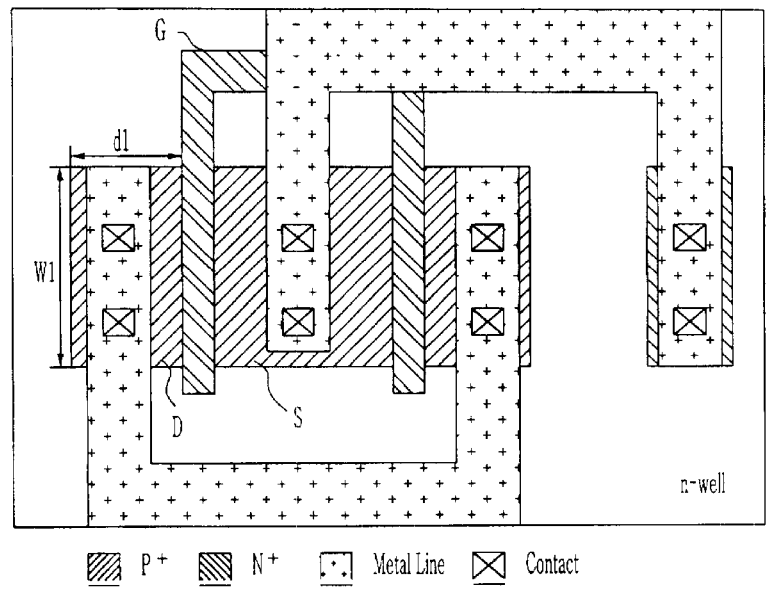
FIG. 7 is a layout diagram for explaining a general PMOS transistor.
Figure 8:
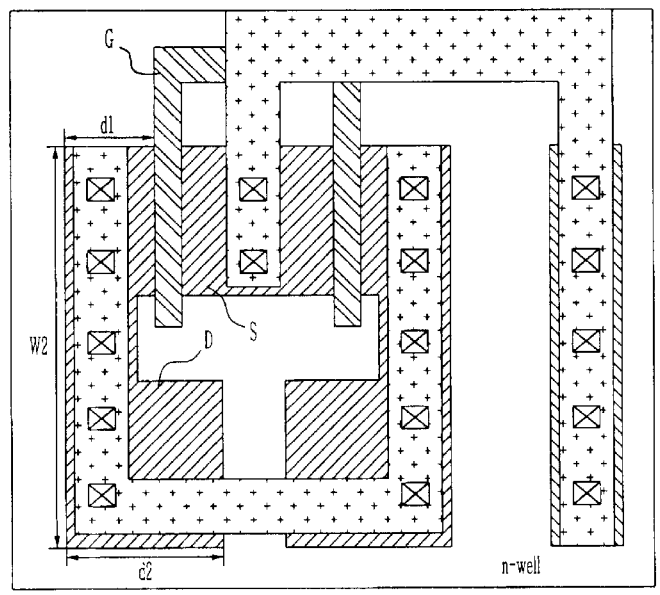
FIG. 8 is a layout diagram for explaining the PMOS transistor in which a drain region is extended according to the present invention.

FIG. 7 is a layout diagram of a general PMOS transistor, and FIG. 8 is a layout diagram of the PMOS transistor the drain region of which is extended compared to the PMOS transistor shown in FIG. 7.

The PMOS transistor the drain region D of which is extended according to the preset invention can be applied to the fifth and sixth PMOS transistors P5 and P6.

Referring now to FIGS. 7 and 8, a general PMOS transistor includes a P+ region having the drain D and the source S at its both sides using the gate G as a boundary, and a N+ region constituting the bulk (n-well) and the junction. Each of the regions is connected to a metal line via contacts.

If this PMOS transistor is used in general applications, as the parasitic capacitance CPDW formed between the drain D and the bulk (n-well) limits the operating speed of the transistor, the drain D and the source S regions are formed with the minimum area provided by a process in order to maximize the characteristic of the transistor. Therefore, 'W1' of the drain D and the source S in the general PMOS transistor is determined by the channel width of the transistor required in the design, and 'd1' with the minimum width where one contact can be located is formed.

As shown in FIG. 8, however, the PMOS transistor proposed by the present invention extends the drain D region up to below the metal line to increase the capacitance CPDW between the drain D and the bulk (n-well). In other words, the P+ region in which the drain D and the source S are formed is extended to a region where the metal line will be formed, wherein the extended portions are spaced by a given distance so that they do not contact the gate G and the extended portions are used as the drain D to increase the drain D region. Therefore, the capacitance CPDW existing in the transistor can be increased by increasing the drain D region from 'W1' to 'W2' or from 'd1' to 'd2' (W2>W1, d2>d1) using the proposed layout scheme. As such, as the proposed PMOS transistor transmits a signal through the capacitor not the channel of the transistor, the capacitance CPDW between the drain D and the output terminal is made bigger, so that the length of the channel can be adjusted while a rapid falling transfer of the output signal of the voltage limiter is made. Thus, the fall and rise transfer time of the output signal and variations in the voltage of the output voltage upon a transfer time can be minimized.

The current cell driving circuit of the present invention can reduce the variations in the output signal to below existing 30% employing the voltage limiter and can accelerate the transfer signal by the capacitance in the PMOS transistor. Therefore, it was found that a less than 0.35 ns transfer time can be obtained and an increase in the power consumption depending on the operating speed can be minimized according to a simulation using 0.35 μm CMOS processor.

Figure 9:
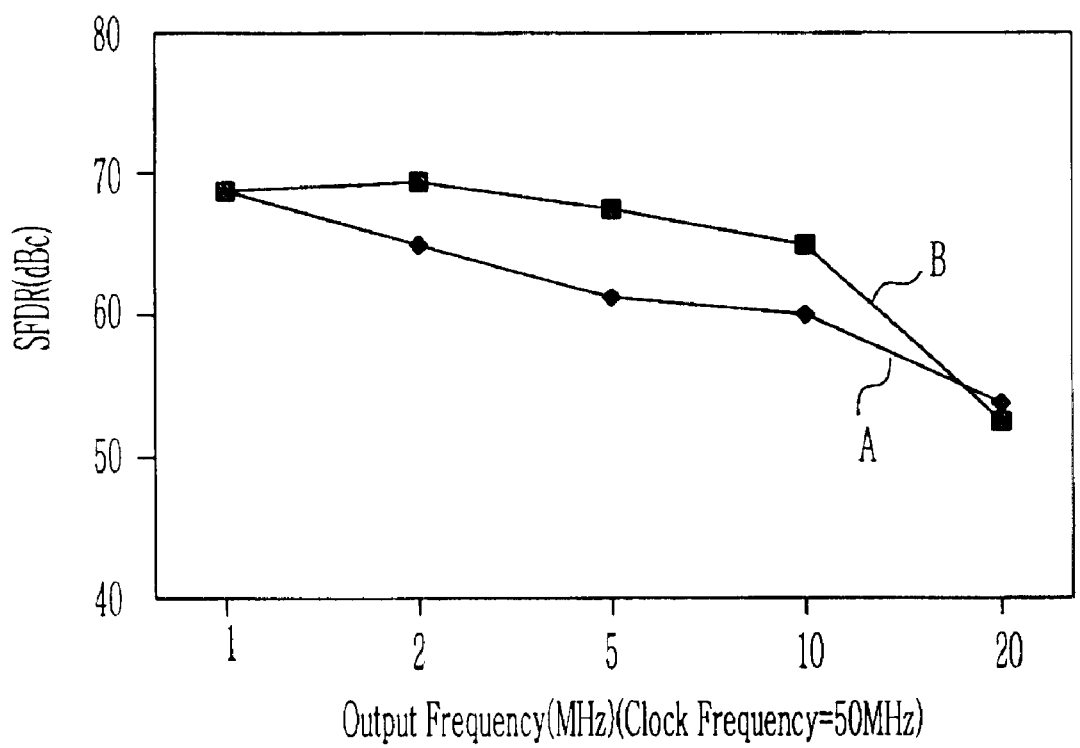
FIG. 9 is a driving characteristic of the digital-to-analog converter that is actually implemented in order to compare a conventional current cell driving circuit and the current cell driving circuit according to the present invention.

FIG. 9 is a graph showing variations in SFDR (Spurious free dynamic range) depending on the output frequency when the DAC of a 10-bit resolution using a current cell driving circuit is driven at 50 MHz clock frequency, in order to compare the conventional current cell driving circuit and the current cell driving circuit of the present invention.

At this time, the driving characteristic waveform of the DAC using the conventional current cell driving circuit is 'A' and the driving characteristic waveform of the DAC using the current cell driving circuit of the present invention is 'B'. The DAC is implemented using 0.35 μm CMOS processor and employs the supply power voltage of 3V.

Referring now to FIG. 9, though two DACs have similar SFDR at a frequency of the output signal below 1 MHz, it can be seen that a lowering in SFDR is significantly improved in case of the DAC using the current cell driving circuit of the present invention as the frequency of the output signal is increased.

As can be understood from the above description, the present invention has an outstanding effect that it can minimize glitch noise of a current cell, by limiting the potential of the differential control signals DP and DN to a given potential level using the voltage limiter at the front end of the current cell and thus reducing the swing width of the current cell.

Further, the present invention can improve the dynamic performance of the DAC by reducing the transfer time of the differential control signals DP and DN using the parasitic capacitance of the PMOS transistor constituting the voltage limiter.

In other words, the present invention can effectively limit the amplitude of the differential control signals DP and DN without compromising the power consumption and the circuit area and also can minimize the transfer time.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A digital-to-analog converter (DAC) including a current cell driving circuit for generating first and second differential control signals and a current cell operating as a current source depending on said first and second differential control signals, the current cell driving circuit comprising:
   a latch means for latching input signals depending on a clock signal to output first and second latch signals; and
   a voltage limiter means for limiting said first and second differential control signals to a given level according to said first and second latch signals,
   wherein said voltage limiter means includes:
      a first inverter for outputting said first differential control signal and level of which is limited to a given level, according to said first latch signal, and
      a second inverter for outputting said second differential control signal the level of which is limited to a given level, according to said second latch signal.

2. The DAC as claimed in claim 1, wherein said first inverter includes:
   a first PMOS transistor connected between a supply power voltage and an output terminal and driven depending on said second latch signal;
   a second PMOS transistor connected between said output terminal and a node and driven depending on a given bias voltage supplied through its gate; and
   a NMOS transistor connected between said node and a ground voltage source and driven depending on said second latch signal.

3. The DAC as claimed in claim 2, wherein a source of said second PMOS transistor is connected to an n-well.

4. The DAC as claimed in claim 3, wherein said second PMOS transistor includes a gate formed on a semiconductor substrate, and source and drain formed on the semiconductor substrate on both sides of the gate, wherein said drain is extended along a common drain line.

5. The DAC as claimed in claim 1, wherein said second inverter includes:
   a first PMOS transistor connected between the supply power voltage and the output terminal and driven depending on said first latch signal;
   a second PMOS transistor connected between said output terminal and a node and driven depending on a given bias voltage supplied through its gate; and
   a NMOS transistor connected between said node and the ground voltage source and driven depending on said first latch signal.

6. The DAC as claimed in claim 5, wherein a source of said second PMOS transistor is connected to an n-well.

7. The DAC as claimed in claim 6, wherein said second PMOS transistor includes a gate formed on a semiconductor substrate, and source and drain formed on the semiconductor substrate on both sides of the gate, wherein said drain is extended along a common drain line.

* * * * *